(12) United States Patent
Shiv et al.

(10) Patent No.: US 6,879,085 B1
(45) Date of Patent: Apr. 12, 2005

(54) RESONANCE SHIFTING

(75) Inventors: Lior Shiv, Hillerode (DK); Izhok Rafaeli, Haifa (IL); Zo'ev Ganor, Harzelia (IL); Nir Kabasikov, Haifa (IL); Hanna Dodiuk-Kenig, Haifa (IL)

(73) Assignee: Nanomotion Ltd., Yokneam (IL)

( * ) Notice: Subject to any disclaimer, the term of this patent is extended or adjusted under 35 U.S.C. 154(b) by 0 days.

(21) Appl. No.: 10/204,809

(22) PCT Filed: Feb. 24, 2000

(86) PCT No.: PCT/IL00/00116

§ 371 (c)(1),
(2), (4) Date: Dec. 12, 2002

(87) PCT Pub. No.: WO01/63679

PCT Pub. Date: Aug. 30, 2001

(51) Int. Cl.$^7$ .............................................. H01L 41/08
(52) U.S. Cl. ...................................................... 310/312
(58) Field of Search ................................. 310/312, 328

(56) References Cited

U.S. PATENT DOCUMENTS

| | | | | |
|---|---|---|---|---|
| 4,447,753 A | * | 5/1984 | Ochiai ......................... 310/312 |
| 4,641,055 A | * | 2/1987 | Tanaka ......................... 310/368 |
| 5,039,899 A | * | 8/1991 | Yamaguchi ............ 310/323.16 |
| 5,453,653 A | | 9/1995 | Zumeris ....................... 310/323 |
| 5,616,980 A | | 4/1997 | Zumeris ....................... 310/323 |
| 5,646,339 A | * | 7/1997 | Bayer et al. ................... 73/105 |
| 5,736,911 A | * | 4/1998 | Watanabe .................... 333/188 |
| 5,894,185 A | * | 4/1999 | Asada et al. ................. 310/368 |
| 5,925,968 A | * | 7/1999 | Yachi et al. ................. 310/320 |
| 6,698,292 B2 | * | 3/2004 | Kikuchi ........................ 73/662 |
| 6,707,234 B1 | * | 3/2004 | Kawashima ................. 310/367 |

FOREIGN PATENT DOCUMENTS

| | | | |
|---|---|---|---|
| EP | 0 633 616 | 1/1995 | .......... H01L/41/09 |
| JP | 55-114015 | * 9/1980 | .................. 310/312 |
| JP | 56-047200 | * 4/1981 | .......... H04R/17/10 |
| JP | 3-265477 | * 11/1991 | .................. 310/311 |
| WO | WO 00/74153 | 12/2000 | .......... H01L/41/09 |
| WO | WO 01/32368 | 5/2001 | .......... B26B/19/28 |

OTHER PUBLICATIONS

"Analysis of Piezoelectric Multiple Mode Resonators Vibrating in Longitudal and Flexural Modes"; H. Jumonji; Electronics and Communications in Japan; vol. 51A, No. 3, 1968, pp. 35–42.

* cited by examiner

*Primary Examiner*—Thomas M. Dougherty
(74) *Attorney, Agent, or Firm*—Fenster & Company

(57) ABSTRACT

A piezoelectric vibrator comprising: a thin rectangular piezoelectric plate formed of a material having a Young's modulus having to short edges surfaces and two long edge surfaces and two long planar face surfaces which plate has transverse resonant vibration modes parallel to its short edges and longitudinal resonant vibration parallel to its long edges and is formed with at least one cavity; and least one electrode on each of the planar surfaces that is electrifiabie to excite at least one vibration mode of the plate, wherein the at least one cavity is not filled with a material having a Young's modulus substantially equal to the Young's modulus of the material from which the place is formed, such that the presence of the at least one cavity shifts a resonant frequency of at least one vibration mode of the plate with respect to the resonant frequency that characterizes the at least one vibration mode in the absence of the at least one cavity.

41 Claims, 9 Drawing Sheets

RESONANCE SHIFTING

The present application is a U.S. national application of PCT/IL00/00116, filed Feb. 24, 2000.

FIELD OF THE INVENTION

The invention relates to piezoelectric motors and in particular to methods for shifting the frequencies of resonant vibrations of piezoelectric motors.

BACKGROUND OF THE INVENTION

A piezoelectric motor uses a piezoelectric vibrator to transduce electrical energy into kinetic energy that the motor transmits to a moveable body to which the motor is coupled. The motor is generally coupled to a body that it moves by resiliently pressing the motor to the body so that a surface region, hereinafter referred to as a "motor-coupling-surface", of its piezoelectric vibrator contacts a surface, hereinafter referred to as a "body-coupling-surface", of the body. Electrodes comprised in the motor are electrified (generally with an AC voltage) to excite vibrations in the vibrator that cause the motor-coupling-surface to vibrate. Motion is transmitted from the vibrating motor-coupling-surface to move the body by frictional forces between the motor-coupling-surface and the body-coupling-surface.

In general, two orthogonal resonant vibration modes of a piezoelectric vibrator are simultaneously excited to generate vibrations in the motor-coupling-surface that are suitable for transmitting motion to the moveable element. A first resonant vibration mode, hereinafter referred to as a "perpendicular vibration mode", moves the motor-coupling-surface back and forth in a direction perpendicular to the body-coupling-surface. A second resonant vibration mode, hereinafter referred to as a "parallel vibration mode", of the vibrator moves the motor-coupling-surface back and forth parallel to the body-coupling-surface. As a result of the perpendicular back and forth motion of the motor-coupling-surface generated by the perpendicular resonant vibration, the two coupling surfaces are alternately coupled and uncoupled during each vibration cycle of the perpendicular vibration mode. During times when the motor-coupling surface and body-coupling-surfaces are in contact, motion of the motor-coupling-surface parallel to the body-coupling-surface generated by the parallel resonant vibration mode transmits motion to the body.

To efficiently transmit motion to a moveable body, the perpendicular and parallel vibration modes of a piezoelectric motor must generally have excitation curves as a function of frequency that overlap substantially. As a result of the overlap, electrodes in the piezoelectric motor can be electrified to excite the vibration modes with an AC driving voltage having a frequency, hereinafter referred to as a "driving frequency", at which energy is simultaneously coupled efficiently to both vibration modes. In addition, when excited, the perpendicular and parallel vibration modes should optimally have a phase difference, hereinafter referred to as a "mode phase difference", close to 90°. If the mode phase difference is substantially different from 90°, the perpendicular and parallel vibration modes are not properly synchronized and efficiency with which motion of the motor-coupling-surface transmits motion to the body is reduced.

For a piezoelectric vibrator, density and Young's modulus of the piezoelectric material from which the vibrator is formed and dimensions of the vibrator determine resonant frequencies of vibration modes of the vibrator. For a given piezoelectric material, characterized by a given Young's modulus and density, the dimensions of the vibrator determine the resonant frequencies. In addition the dimensions determine other operational characteristics of the vibrator. For example, the amplitude of motion of a motor-coupling-surface of the vibrator and the amount of power that the vibrator can provide for moving a body are functions of dimensions of the vibrator as well as the magnitude of an applied excitation voltage. Maximum strain in the body of the vibrator, for a given excitation voltage, is also a function of dimensions of the vibrator.

As a result of the many operational parameters of a piezoelectric vibrator that are functions of the vibrator's dimensions, it is generally not possible to determine dimensions of a vibrator that optimize all operational characteristics of the vibrator. In particular, it is not always possible or practical to determine dimensions of a vibrator so that excitation curves of a perpendicular and a parallel vibration mode overlap at a frequency at which both vibration modes can be efficiently excited with a 90° mode phase difference. It is therefore advantageous to have a method for shifting resonant frequencies of a vibrator without having to substantially change dimensions of the vibrator. Such a method could be useable to shift resonant frequencies of a perpendicular and parallel vibration mode of a vibrator to adjust overlap of their excitation curves and improve efficiency with which the vibration modes can be simultaneously excited with a mode phase difference close to 90°.

In some situations, instead of requiring two orthogonal vibration modes to impart motion to a moveable body, a piezoelectric motor is required to provide one-dimensional motion of a motor-coupling-surface. For such motion, optimum efficiency of operation of the motor is generally achieved when only a single vibration mode is excited in the motor's vibrator. For a vibrator having dimensions that provide some desired characteristics of the required motion, more than one vibration mode may be excited at a driving frequency at which the motor is to be operated. In such cases it is desirable to have a method for diverging resonant frequencies of vibration modes that are simultaneously excited without substantially changing dimensions of the vibrator so as to separate their excitation curves and enable excitation of substantially only the single vibration mode of the vibrator.

PCT Application PCT/IL99/00576 entitled "Piezoelectric Motors And Motor Driving Configurations", the disclosure of which is incorporated herein by reference, describes situations for which excitation of a single vibration mode is advantageous. In the application, shavers are described that comprise a piezoelectric motor that is used to excite vibrations in cutting blades comprised in the shavers. A one-dimensional motion generated in a motor-coupling-surface of the piezoelectric motor is used to excite the vibrations.

Another situation for which it is sometimes desirable to diverge resonant vibration modes of a piezoelectric vibrator occurs, for example, when it is desired to separately control perpendicular and parallel vibration modes of a piezoelectric vibrator. Optimum control of the vibration modes is obtained when the excitation curves of the vibration modes are sufficiently separated so that energy can be coupled to either one of the vibration modes without substantially coupling energy to the other of the vibration modes. Examples of situations for which it is advantageous to excite perpendicular and parallel vibration modes of a vibrator separately, and methods for exciting the vibration modes, are described in PCT Application PCT/IL99/00288, entitled "Multilayer Piezoelectric Motor", the disclosure of which is incorporated herein by reference.

It is also desirable to be able to shift a resonant frequency of a vibration mode of a vibrator in order to reduce a difference that the frequency may have from a desired frequency that is caused by inaccuracies in the process by which the vibrator is manufactured. For example, assume that in a manufacturing process of a vibrator in the shape of a relatively thin rectangular plate having large face surfaces and narrow long and short edge surfaces, the length of the vibrator is held to a tolerance of 1%. Assume further that a desired resonant frequency of a vibration mode of the vibrator for which mass points of the vibrator vibrate parallel to the length of the vibrator is, by way of example 50 kHz. Since the length of the vibrator may vary by as much as 1%, the resonant frequency, which is proportional to the inverse of the length, may vary by as much as 0.5 kHz from 50 kHz. It is desirable to be able to shift the resonant frequency after manufacture of the vibrator to compensate for the variance.

Thin rectangular piezoelectric vibrators are described in U.S. Pat. No. 5,616,980 to Zumeris, the disclosure of which is incorporated herein by reference. Various methods are used to mount these motors in machines and apparatus in which they are used. One of the mounting methods used, which is described in the patent comprises forming mounting holes that pass through the body of the vibrator in directions perpendicular to the vibrator's large face surfaces. The vibrator is held in place in the machine or apparatus by mounting pins anchored to the machine or apparatus that pass through the mounting holes. Spaces between the mounting holes and the mounting pins are preferably filled with a flexible material. As described in the patent, characteristics of the filler material are preferably chosen to match the acoustic velocity of the filler to the acoustic velocity of the piezoelectric material from which the vibrator is formed. Matching the acoustic velocities reduces the amount by which the holes and the pins disturb resonant frequencies of the vibrator.

SUMMARY OF THE INVENTION

An aspect of some preferred embodiments of the present invention relates to providing a method for shifting resonant frequencies of vibration modes of a piezoelectric vibrator without substantially changing overall dimensions of the piezoelectric vibrator.

The inventors have found that by introducing perturbations in the structure of a piezoelectric vibrator that do not substantially change the overall dimensions of the vibrator resonant frequencies of the vibrator can be shifted.

An aspect of some preferred embodiments of the present invention relates to perturbing the structure of a piezoelectric vibrator by forming holes in the body of the vibrator to shift resonant frequencies of vibration modes of the vibrator.

The inventors have found that resonant frequencies of vibration modes of a piezoelectric vibrator can be shifted by forming at least one hole in the vibrator. The magnitude and direction of a shift in a resonant frequency caused by the at least one hole is generally dependent on the number and size of holes and their spatial location relative to nodes and antinodes of the vibration mode.

The presence of a hole in a piezoelectric vibrator decreases the average values of the density and Young's modulus of the piezoelectric material from which the vibrator is formed in the vicinity of the hole or groove. A decrease in Young's modulus decreases the resonant frequencies of vibration modes of the vibrator. A decrease in density increases the resonant frequencies of vibration modes of the vibrator. A hole in a vibrator therefore affects the resonant frequencies of the vibrator in conflicting manners. On one hand a hole tends to decrease the resonant frequencies of the vibration modes by decreasing (locally) Young's modulus. On the other hand the same hole tends to increase the resonant frequencies by decreasing (locally) the density of the vibrator.

However, the amount of the decrease or increase in the resonant frequency of a vibration mode of the vibrator is dependent upon the location of the hole. If the hole is located in a region of the vibrator which for a particular vibration mode is a region of maximum strain, the effect of the hole on Young's modulus tends to dominate the effect of the hole on density in shifting the resonant frequency. As a result, the resonant frequency will generally decrease. If on the other hand, the hole is located in a region of minimum strain of the material of the vibrator, the effect of the hole on density tends to dominate the effect of the hole on Young's modulus in shifting the resonant frequency. As a result, the resonant frequency will generally increase. Regions of maximum material strain are located at and near to nodes of the vibration mode while regions of relatively little strain are located at and near antinodes of the vibration mode.

An aspect of some preferred embodiments of the present invention relates to perturbing the structure of a piezoelectric vibrator by forming at least one groove in a surface region of the vibrator to shift resonant frequencies of vibration modes of the vibrator.

The inventors have found that, as in the case of a hole in a vibrator, a grove on the surface of a vibrator generally affects resonant frequencies of the vibrator by affecting the density and Young's modulus of material from which the vibrator is formed in the vicinitv of the groove. A groove also affects the resonant frequencies by perturbing an external dimension of the vibrator on which the resonant frequencies depend.

In some preferred embodiments of the present invention, at least one groove is formed on the surface of a vibrator to introduce a perturbation in a dimension of the vibrator on which the resonant frequency of a vibration mode of the vibrator depends. The perturbation effectively shortens the dimension. If the effect of the perturbation dominates Young's modulus and density effects on the resonant frequency, the frequency increases or decreases in response to the shortening of the dimension in accordance with the form of the frequency's dependence on the dimension. The magnitude and direction of a shift in a resonant frequency caused by the at least one groove is generally dependent on the number and size of the at least one groove and the location of the at least one groove on the surface of the vibrator.

An aspect of some preferred embodiments of the present invention relates to shifting resonant frequencies of a piezoelectric vibrator to compensate for variances of the resonant frequencies of the vibrator from desired frequencies. These variances can arise, for example, from inaccuracies in the manufacturing process of the vibrator that result in dimensions of the vibrator differing from desired dimensions or from variances in characteristics of the piezoelectric material from which the vibrator is formed. The magnitudes of the variances can be reduced by shifting the frequencies in accordance with a preferred embodiment of the present invention, by forming holes and/or grooves in the vibrator.

An aspect of some preferred embodiments of the present invention relates to shifting a resonant frequency of a vibration mode of piezoelectric vibrator from a first desired resonant frequency to a second desired frequency.

A vibrator manufactured to operate at a first frequency can be adapted to applications requiring that the vibrator operate at a second frequency by forming at least one hole or at least one groove in the vibrator, in accordance with a preferred embodiment of the present invention. As a result a manufacturing process used to produce the vibrator that operates at the first frequency does not have to be retooled or substantially changed to produce vibrators that operate at the second frequency.

An aspect of some preferred embodiments of the present invention relates to converging or diverging the frequency ranges of excitation curves of parallel and perpendicular vibration modes of a vibrator of a piezoelectric motor to improve the efficiency with which the motor transmits motion to a body to which it is coupled. The excitation curves are converged or diverged so that they overlap at a frequency at which both modes can be relatively efficiently excited and with a mode phase difference close to 90°. The excitation curves are converged or diverged by forming at least one hole or at least one groove in the vibrator to shift the resonant frequency of at least one of the vibration modes so as to converge or diverge thereby the excitation curves.

In a preferred embodiment of the present invention the piezoelectric vibrator is a relatively thin rectangular piezoelectric vibrator having relatively large parallel face surfaces and narrow long and short edge surfaces. Preferably, a first order longitudinal vibration mode of the vibrator and a second order transverse vibration mode of the vibrator are respectively perpendicular and parallel vibration modes that are used to impart motion to a body. Whereas the following discussion generally relates to a first order longitudinal vibration mode and a second order transverse vibration mode, results and features described for these vibration modes are applicable to other vibration modes of the vibrator.

In a preferred embodiment of the present invention, the resonant frequency of the second order transverse mode is less than the resonant frequency of the first order longitudinal vibration mode. At least one hole perpendicular to the large face surfaces is formed in the body of the piezoelectric vibrator to converge the resonant frequencies of the vibration modes and thereby the excitation curves of the vibration modes. Preferably, the at least one hole is a through hole. The at least one hole is preferably formed at a point along a long axis of the motor that passes through the center of the motor parallel to the long edges of the piezoelectric motor. Preferably the at least one hole is located on the axis at an antinode of the transverse vibration mode. The antinodes of the second transverse mode are located relatively close to the single node of the first longitudinal vibration mode. The inventors have found that the at least one hole causes the resonant frequency of the longitudinal vibration mode to decrease while the resonant frequency of the transverse mode increases or is substantially unaffected by the at least one hole. As a result, the resonant frequencies and the excitation curves of the two modes converge.

If the at least one hole is located at a nodal point of the transverse mode that is removed from the nodal point of the longitudinal vibration mode, the resonant frequency of the transverse mode decreases while the resonant frequency of the longitudinal mode increases and the resonant frequencies diverge. If the at least one hole is located at the center of the vibrator, which is a nodal point for both the transverse and longitudinal vibration modes, the frequencies of both modes decrease. However, the inventors have found that the decrease in the frequency of the longitudinal vibration mode tends to be smaller than that of the transverse mode and the resonant frequencies diverge.

It should be noted that a localized protuberance on a surface of a vibrator generates a shift in a resonant frequency of the vibrator that is opposite to a shift in the resonant frequency that is generated by a hole in the vibrator at the same location as the protuberance. For example, in a thin rectangular vibrator, if a hole on a face surface of the vibrator increases or decreases a resonant frequency of a vibration mode of the vibrator, a protuberance in place of the hole will generally respectively decrease or increase the resonant frequency.

In a preferred embodiment of the present invention at least one groove is formed on a narrow edge surface of the piezoelectric vibrator. The inventors have found that the at least one groove shifts resonant frequencies of the vibration modes away from each other and diverges thereby their excitation curves. If the at least one groove is located on a long edge surface of the vibrator, the at least one groove causes the resonant frequency of the transverse mode to decrease but does not substantially affect the resonant frequency of the longitudinal vibration mode, and diverges thereby the excitation curves. If the at least one groove is located on a short edge of the vibrator, the at least one groove does not substantially affect the resonant frequency of the transverse vibration mode but causes the resonant frequency of the longitudinal vibration mode to increase, and diverges thereby the excitation curves.

An aspect of some preferred embodiments of the present invention relates to reducing the occurrence of cracks in the body of a piezoelectric vibrator that are encouraged by the presence of a hole in the body of the vibrator or a groove on its surface.

In accordance with a preferred embodiment of the present invention a layer of resilient material is bonded to the surface of a hole or groove formed in the piezoelectric vibrator. The layer functions as a "crack arrest" layer that reduces fracturing of the vibrator in the vicinity of the hole or groove that results from strain of piezoelectric material from which the vibrator is formed. Preferably, the crack arrest material is an epoxy that bonds strongly to the material of the vibrator.

There is therefore provided in accordance with a preferred embodiment of the present invention a piezoelectric vibrator comprising:

a thin rectangular piezoelectric plate formed of a material having a Young's modulus having two short edge surfaces and two long edge surfaces and two large planar face surfaces which plate has transverse resonant vibration modes parallel to its short edges and longitudinal resonant vibration modes parallel to its long edges and is formed with at least one cavity, and at least one electrode on each of the planar surfaces that is electrifiable to excite at least one vibration mode of the plate, wherein the at least one cavity is not filled with a material having a Young's modulus substantially equal to the Young's modulus of the material from which the plate is formed, such that the presence of the at least one cavity shifts a resonant frequency of at least one vibration mode of the plate with respect to the resonant frequency that characterizes the at least one vibration mode in the absence of the at least one cavity.

Preferably, the at least one cavity comprises a hole in a planar surface of the plate. In some preferred embodiment of the present invention the hole is located in a neighborhood of an antinode of a vibration mode of the plate and the presence of the hole increases the resonant frequency of the vibration mode. Preferably, wherein the hole is located substantially at the position of the antinode of the vibration mode. In some preferred embodiment of the present invention the hole is located in a neighborhood of a node of a vibration mode and decreases the resonant frequency of the vibration mode. Preferably, the hole is located substantially at the position of the node of the vibration mode.

In some preferred embodiment of the present invention the at least one vibration mode includes a first and a second vibration mode and the hole is located so as to shift the resonant frequencies of the first and second vibration mode of the plate so that the resonant frequencies converge.

In some preferred embodiment of the present invention the at least one vibration mode includes a first and a second vibration mode and the hole is located so as to shift the resonant frequencies of the first and second vibration mode of the plate so that the resonant frequencies diverge.

In some preferred embodiment of the present invention a same single frequency AC voltage cannot simultaneously excite the first vibration mode and the second vibration mode of the plate in the absence of the hole and the convergence caused by the hole is such that the first and second vibration modes are simultaneously excitable by a same single frequency AC voltage.

In some preferred embodiment of the present invention, in the absence of the hole the first and second vibration modes are simultaneously excitable by a same single frequency AC voltage and the convergence caused by the hole is such that the efficiency with which the first and second vibration modes are simultaneously excitable by a same single frequency AC voltage is increased.

In some preferred embodiment of the present invention, a same single frequency AC voltage cannot simultaneously excite the first and second vibration modes in the absence of the hole and the convergence caused by the hole is such that the first and second vibration modes are simultaneously excitable by a same single frequency AC voltage.

In some preferred embodiment of the present invention when the first and second vibration modes are excited by the single frequency AC voltage, a phase difference between the excited first and second vibration modes is substantially equal to 90°.

In some preferred embodiment of the present invention in the absence of the hole a same single frequency AC voltage cannot be used to simultaneously excite both vibration modes such that a phase difference between the excited vibration modes is substantially equal to 90°, and the shift caused by the presence of the hole is such that a same single frequency AC voltage can be used to simultaneously excite both vibration modes with a phase difference between the excited vibration modes substantially equal to 90°.

In some preferred embodiment of the present invention, in the absence of the hole a same single frequency AC voltage can efficiently excite both vibration modes and the divergence caused by the presence of the hole is such that a same single frequency AC voltage cannot efficiently excite both vibration modes.

In some preferred embodiment of the present invention the hole is located in a neighborhood of a node of the first vibration mode and decreases the resonant frequency of the first vibration mode. Preferably, the hole is located substantially at the position of the node of the first vibration mode.

In some preferred embodiment of the present invention wherein the hole is located in a neighborhood of an antinode of the second vibration mode and increases the resonant frequency of the first vibration mode. Preferably, the hole is located substantially at the position of the antinode of the second vibration mode.

In some preferred embodiment of the present invention the hole is located in a neighborhood of a node of the first vibration mode and a neighborhood of an antinode of the second vibration mode.

In some preferred embodiment of the present invention the first vibration mode is a longitudinal vibration mode of the plate. In some preferred embodiment of the present invention the second vibration mode is a transverse vibration mode of the plate.

In some preferred embodiment of the present invention, the hole is a through hole.

In some preferred embodiment of the present invention, the at least one cavity comprises a groove on at least one long edge surface of the plate that reduces a resonant frequency of a transverse vibration mode of the plate.

In some preferred embodiment of the present invention, the at least one cavity comprises a groove on at least one short edge surface of the plate that increases a resonant frequency of a longitudinal vibration mode of the plate.

In some preferred embodiment of the present invention, the at least one vibration mode includes first and second vibration modes and the at least one cavity comprises at least one groove located on an edge surface of the plate so as to shift the resonant frequencies of the first and second vibration modes so that they converge.

In some preferred embodiment of the present invention, the at least one vibration mode includes first and second vibration modes and the at least one cavity comprises at least one groove located on an edge surface of the plate so as to shift the resonant frequencies of the first and second vibration modes so that they diverge.

In some preferred embodiment of the present invention, a same single frequency AC voltage cannot simultaneously excite the first vibration mode and the second vibration mode of the plate in the absence of the at least one groove and the convergence caused by the at least one groove is such that the first and second vibration modes are simultaneously excitable by a same single frequency AC voltage.

In some preferred embodiment of the present invention, in the absence of the hole the first and second vibration modes are simultaneously excitable by a same single frequency AC voltage and the convergence caused by caused by the at least one groove such that the efficiency with which the first and second vibration modes are simultaneously excitable by a same single frequency AC voltage is increased.

In some preferred embodiment of the present invention, a same single frequency AC voltage cannot simultaneously excite the first and second vibration modes in the absence of the at least one groove and the convergence caused by the at least one groove is such that the first and second vibration modes are simultaneously excitable by a same single frequency AC voltage.

In some preferred embodiment of the present invention, when the first and second vibration modes are excited by the single frequency AC voltage, a phase difference between the excited first and second vibration modes is substantially equal to 90°.

In some preferred embodiment of the present invention, in the absence of the at least one groove a same single frequency AC voltage cannot be used to simultaneously excite both vibration modes such that a phase difference between the excited vibration modes is substantially equal to 90°, and the shift caused by the presence of the at least one groove is such that a same single frequency AC voltage can be used to simultaneously excite both vibration modes with a phase difference between the excited vibration modes substantially equal to 90°.

In some preferred embodiment of the present invention, the first vibration mode is a longitudinal vibration mode. Preferably, the at least one groove comprises a groove on a short edge surface of the vibrator that increases the frequency of the vibration mode.

In some preferred embodiment of the present invention, the second vibration mode is a transverse vibration mode. Preferably, the at least one groove comprise a groove on a long edge surface of the vibrator.

In some preferred embodiment of the present invention, the plate comprises at least one protuberance formed on a face surface of the plate that shifts a resonant frequency of at least one vibration mode of the plate with respect to the resonant frequency that characterizes the at least one vibration mode in the absence of the at least one protuberance.

In some preferred embodiment of the present invention, a layer of an elastic material is bonded to the wall of the cavity. In some preferred embodiment of the present invention, a cavity of the at least one cavity is filled with an elastic material that bonds to the material from which the plate is formed and has a Young's modulus different from that of the material of the plate.

There is further provided, in accordance with a preferred embodiment of the present invention piezoelectric vibrator comprising:

a thin rectangular piezoelectric plate having two short edge surfaces and two long edge surfaces and two large planar face surfaces which plate has transverse resonant vibration modes parallel to its short edges and longitudinal resonant vibration modes parallel to its long edges and is formed with at least one localized protuberance on a planar face surface; and at least one electrode on each of the planar surfaces that is electrifiable to excite a vibration mode of the plate;

wherein the at least one localized protuberance shifts a resonant frequency of at least one vibration mode of the plate with respect to the resonant frequency that characterizes the at least one vibration mode in the absence of the at least one cavity.

In some preferred embodiment of the present invention, the at least one protuberance is located in a neighborhood of an antinode of a vibration mode of the plate and wherein the presence of the protuberance decreases the resonant frequency of the vibration mode. Preferably, the protuberance is located substantially at the position of the antinode of the vibration mode.

In some preferred embodiment of the present invention, a protuberance of the at least one protuberance is located in a neighborhood of a node of a vibration mode and increases the resonant frequency of the vibration mode. Preferably, the protuberance is located substantially at the position of the node of the vibration mode.

In some preferred embodiment of the present invention, the at least one vibration mode includes a first and a second vibration mode and wherein a protuberance of the at least one protuberance is located so as to shift the resonant frequencies of the first and second vibration mode of the plate so that the resonant frequencies converge.

In some preferred embodiment of the present invention, the at least one vibration mode includes a first and a second vibration mode and wherein a protuberance of the at least one protuberance is located so as to shift the resonant frequencies of the first and second vibration mode of the plate so that the resonant frequencies diverge.

In some preferred embodiment of the present invention, a same single frequency AC voltage cannot simultaneously excite the first vibration mode and the second vibration mode of the plate in the absence of the protuberance and wherein the convergence caused by the protuberance is such that the first and second vibration modes are simultaneously excitable by a same single frequency AC voltage.

In some preferred embodiment of the present invention, in the absence of the protuberance the first and second vibration modes are simultaneously excitable by a same single frequency AC voltage and wherein the convergence caused by the protuberance is such that the efficiency with which the first and second vibration modes are simultaneously excitable by a same single frequency AC voltage is increased.

In some preferred embodiment of the present invention, a same single frequency AC voltage cannot simultaneously excite the first and second vibration modes in the absence of the protuberance and wherein the convergence caused by the protuberance is such that the first and second vibration modes are simultaneously excitable by a same single frequency AC voltage.

In some preferred embodiment of the present invention, when the first and second vibration modes are excited by the single frequency AC voltage, a phase difference between the excited first and second vibration modes is substantially equal to 90°.

In some preferred embodiment of the present invention, in the absence of the protuberance a same single frequency AC voltage cannot be used to simultaneously excite both vibration modes such that a phase difference between the excited vibration modes is substantially equal to 90°, and the shift caused by the presence of the protuberance is such that a same single frequency AC voltage can be used to simultaneously excite both vibration modes with a phase difference between the excited vibration modes substantially equal to 90°.

In some preferred embodiment of the present invention, the first vibration mode is a longitudinal vibration mode. In some preferred embodiment of the present invention, the second vibration mode is a transverse vibration mode.

In some preferred embodiment of the present invention, the transverse vibration mode is a second order transverse vibration mode of the vibrator. In some preferred embodiment of the present invention, the longitudinal vibration mode is a first order longitudinal vibration mode.

There is further provided, in accordance with a preferred embodiment of the present invention, a method for reducing a tendency for a piezoelectric vibrator to fracture in a neighborhood of a cavity defined by a cavity wall on a surface of the vibrator or in the body of the vibrator comprising determining an elastic material that bonds to the material from which the piezoelectric vibrator is formed; and bonding the elastic material to the cavity wall.

In some preferred embodiment of the present invention, bonding the elastic material to the cavity wall comprises forming a layer of the elastic material on the cavity w all.

In some preferred embodiment of the present invention, the cavity is a hole in the body of the vibrator and bonding the elastic material to the cavity wall comprises filling the hole with the elastic material.

BRIEF DESCRIPTION OF FIGURES

The invention will be more clearly understood from the following description of preferred embodiments thereof, read with reference to the figures attached hereto. In the figures, identical structures, elements or parts that appear in more than one figure are generally labeled with the same numeral in all the figures in which they appear. Dimensions of components and features shown in the figures are chosen for convenience and clarity of presentation and are not necessarily shown to scale. The figures are listed below.

DETAILED DESCRIPTION OF PREFERRED EMBODIMENTS

Figure 1A:
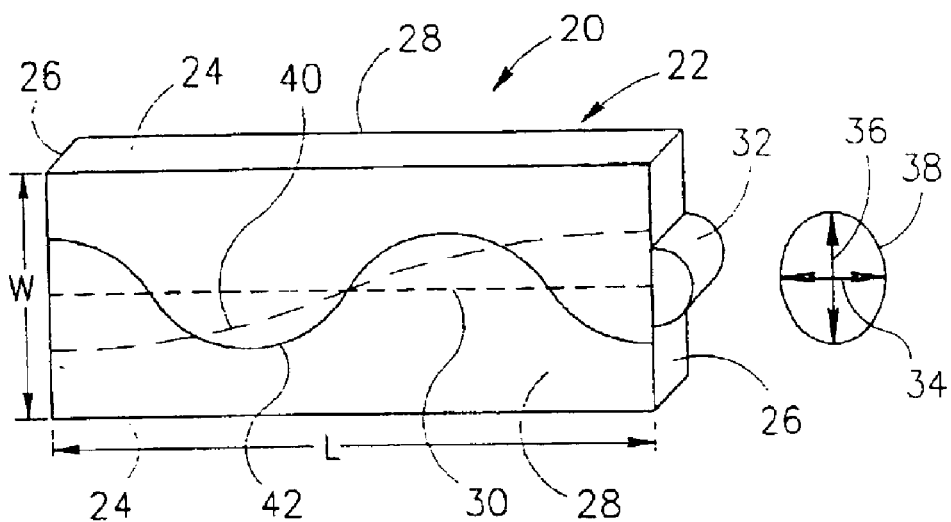
FIG. 1A schematically shows a piezoelectric motor according to prior art.

FIG. 1A schematically shows a piezoelectric motor 20 of a type described in U.S. Pat. No. 5,453,653 to Zumeris et al, the disclosure of which is incorporated herein by reference. Piezoelectric motor 20 comprises a thin rectangular piezoelectric vibrator 27 having long edge surfaces 24 and short edge surfaces 26 and large parallel face surfaces 28. The length of long edge surfaces 22 and the length of short edge surfaces 26 (i.e. the width of vibrator 22) are noted as "L" and "W" respectively. A long axis 30 of piezoelectric motor 20, shown with a dashed line, passes through the center of vibrator 22 parallel to long edge surfaces 24. Various surface regions of piezoelectric motor 20 may be used for a motor-coupling-surface and some piezoelectric motors similar to piezoelectric motor 20 have more than one motor-coupling-surface. Generally, a region of a short edge surface 26 or a surface of a friction nub located on a short edge surface 26 functions as a motor-coupling-surface. In FIG. 1A, piezoelectric motor 20 is shown, by way of example, with a friction nub 32 mounted to a short edge 26 of the piezoelectric motor.

A longitudinal vibration mode of vibrator 22, for which mass points of vibrator 22 and friction nub 32 vibrate parallel to axis 30, functions as a perpendicular vibration mode of the vibrator. The longitudinal vibration mode couples vibrator 22 to a body that piezoelectric motor 20 moves. Preferably, the longitudinal mode is a first order longitudinal mode. A transverse vibration mode of vibrator 22, for which mass points of the vibrator and friction nub 32 vibrate parallel to short edge surfaces 26, functions as a parallel vibration mode of the vibrator. Motion of friction nub 32 generated by the transverse vibration mode transmits energy to the body that the motor moves when the longitudinal vibration mode couples vibrator 22 to the body. Preferably, the transverse vibration mode is a second order transverse vibration mode of vibrator 22.

Directions of the longitudinal and transverse vibrations are indicated by double arrowhead lines 34 and 36 respectively. The longitudinal and transverse vibration modes generate elliptical vibratory motion in friction nub 32, which elliptical motion is represented by an ellipse 38. Electrodes (not shown) on large face surfaces 28 of vibrator 22 are electrified with an AC driving voltage to excite the longitudinal and transverse vibration modes. For a given magnitude AC driving voltage, the eccentricity of ellipse 38 and the direction of its major axis are functions of a phase difference between the longitudinal and transverse vibration modes.

The relative amplitude of the first order longitudinal vibration mode as a function of position along axis 30 is represented by the distance of a curve 40, shown with a dashed line, above or below axis 30. The distance of a curve 42 above or below axis 30 represents the relative amplitude of the second transverse vibration mode as a function of position along axis 30. Nodal regions of the longitudinal and transverse vibration modes are plane surfaces in vibrator 22 that are parallel to short edge surfaces 26 and pass through axis 30 at points at which curves 40 and 42 respectively intersect axis 30.

To within a scale factor determined by the length L of piezoelectric vibrator 22, the frequencies of the resonant transverse and longitudinal vibration modes of piezoelectric vibrator 22 are substantially determined by a ratio, hereinafter referred to as an "aspect ratio", of the width W to the length L of the vibrator. The transverse resonant frequencies of piezoelectric vibrator 22 are strongly dependent on the aspect ratio while the longitudinal resonant frequencies are relatively insensitive to the aspect ratio. The resonant frequencies scale substantially as the inverse of the length of piezoelectric vibrator 22. Methods for calculating values for the frequencies of the resonant longitudinal and transverse vibration modes of piezoelectric vibrator 22 are well known in the art. Such methods may be found, for example, in "Vibration Problems in Engineering" by S. Timoshenko and D. H. Young (co-author of the third edition) or in "Analysis of Piezoelectric Multiple Mode Resonators Vibrating in Longitudinal and Flexural Modes"; H. Jumonji; Electronics and Communications in Japan; Vol 51A, No. 3, 1968, pp 35–42, the disclosures of which are incorporated herein by reference.

Figure 1B:
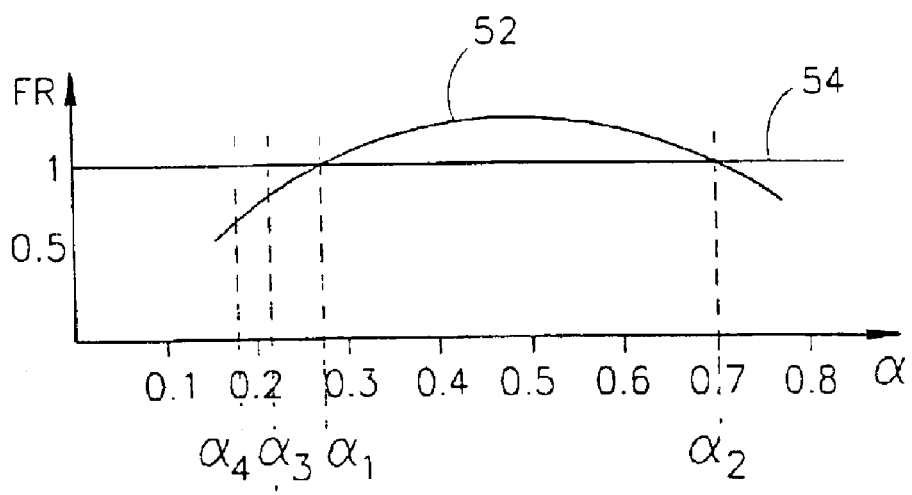
FIG. 1B is a graph that shows dependence of a ratio between the resonant frequencies of a first order longitudinal and a second order transverse vibration mode of the vibrator of the piezoelectric motor shown in FIG. 1A on dimensions of the vibrator, according to prior art.

FIG. 1B is a graph of a ratio of the resonant frequency of the second transverse vibration mode of vibrator 22 to the resonant frequency of the first longitudinal vibration mode of vibrator 22 as a function of aspect ratio of the vibrator. The aspect ratio, represented by "α" (α=W/L), is shown along the abscissa and the ratio of the resonant frequencies, represented by "FR", is shown along the ordinate. A curve 52 shows the values of FR as a function of a for piezoelectric vibrator 22. A straight line 54 parallel to the abscissa having ordinate equal to one represents the resonant frequency, normalized to itself, of the first longitudinal resonant mode of piezoelectric vibrator 22).

Curve 52 crosses line 54 at aspect ratios $\alpha_1$ and $\alpha_2$. For these aspect ratios, resonant frequencies of the transverse and longitudinal vibration modes are equal and the excitation curves of the vibration modes overlap substantially completely. However, for these aspect ratios, the mode phase difference between the transverse and longitudinal vibration modes is substantially equal to zero. The vibration modes are substantially in phase. As a result, the vibration modes are highly inefficient at transmitting motion to a body to which piezoelectric motor 22 is coupled.

Figure 1C:
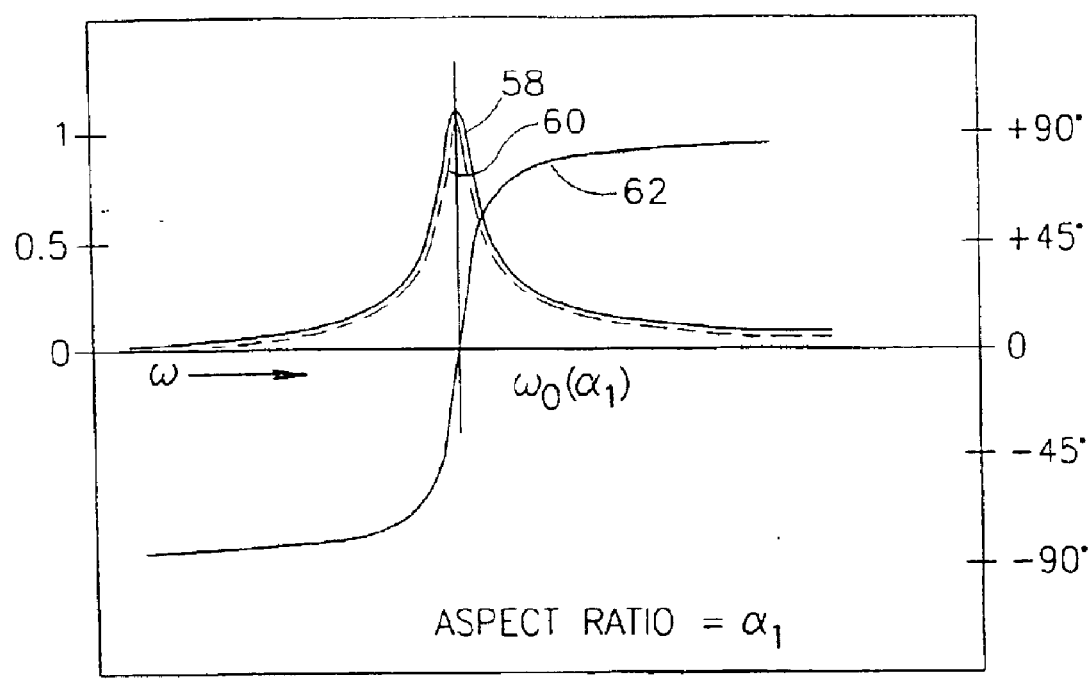
FIGS. 1C–1E are graphs of excitation curves for the first order longitudinal vibration mode and second order transverse vibration mode of the piezoelectric motor shown in FIG. 1A for different dimensions of the vibrator, according to prior art.

FIG. 1C is a graph, for aspect ratio $\alpha_1$, that shows schematic excitation curves 58 and 60 for the longitudinal and transverse vibration modes respectively as functions of frequency a, i.e. a driving frequency, of an AC driving voltage used to excite the vibration modes. Excitation curve 60 is shown with a dashed line and slightly offset from excitation curve 58 for clarity of presentation. Curves 58 and 60 have a maximum at a frequency $\omega_o(\alpha_1)$ which is a resonant frequency of both the longitudinal and transverse vibration modes for aspect ratio $\alpha_1$. Excitation curves 58 and 60 are normalized so that their maxima are equal to one. The height of excitation curves 58 and 60 at any frequency is therefore equal to the relative efficiency with which energy is coupled to the longitudinal and transverse vibration modes respectively compared to the efficiency with which energy is coupled to the vibration modes at the resonant frequency $\omega_o(\alpha_1)$. An ordinate axis for excitation curves 58 and 60 is shown at the left of FIG. 1C. The scale of the abscissa in FIG. 1C is arbitrary.

A curve 62 in FIG. 1C schematically graphs a phase difference, hereinafter referred to as an "excitation phase difference", between the phase of each of the vibration modes and the phase of the driving voltage as a function of co. (The excitation phase difference is different from the mode phase difference, which is the difference between the phases of the vibration modes.) Since the mode phase difference between the longitudinal and transverse vibration modes is substantially zero, the excitation phase differences for both modes are substantially the same for all frequencies ω. A single curve (curve 62) is therefore sufficient to graph the excitation phase differences for both vibration modes. The magnitude of an excitation phase difference is shown along an ordinate axis at the right of FIG. 1C. For frequencies less than $\omega_o(\alpha_1)$ the phase of the driving voltage lags the phases of the vibration modes and the excitation phase difference of both vibration modes is negative. For frequencies substantially less than $\omega_o(\alpha 1)$, the excitation phase difference is close to −90°. For frequencies greater than $\omega_o(\alpha 1)$, the phase of the driving voltage leads the vibration modes and the excitation phase difference of both vibration modes is positive. For frequencies substantially greater than $\omega_o(\alpha_1)$ the excitation phase difference is close to +90°.

In order to excite the longitudinal and transverse vibration modes with a mode phase difference close to 90°, the resonant frequencies of the longitudinal and transverse vibration modes have to be diverged. This can be accomplished by choosing an appropriate aspect ratio for vibrator 22 in the neighborhood of either aspect ratio $\alpha_1$ or aspect ratio $\alpha_2$ that is greater than or less than aspect ratio $\alpha_1$ or $\alpha_2$ respectively.

For aspect ratios in the neighborhood of aspect ratio $\alpha_2$, the width of vibrator 22 is relatively large and the amplitude of the transverse vibration mode for aspect ratios in this neighborhood is generally too small to be useful for transmitting motion to a body to which piezoelectric motor 20 is coupled. On the other hand, aspect ratios in the neighborhood of aspect ratio $\alpha_1$ generally provide amplitudes of motion for both the longitudinal and transverse vibration modes that are suitable for moving the body.

Let $\alpha_3$ (shown in FIG. 1B) represent an aspect ratio for vibrator 22 in the neighborhood of $\alpha_1$ for which the transverse and longitudinal vibration modes, when excited, have a 90° mode phase difference. Since, for a same excitation voltage used to excite vibrations in piezoelectric vibrator 22, an amplitude of vibration of the transverse vibration mode is larger for a lower aspect ratio than for a higher aspect ratio, preferably $\alpha_3$ is less than $\alpha_1$. In FIG. 1B, $\alpha_3$ is shown by way of example having a value smaller than $\alpha_1$.

Figure 1D:
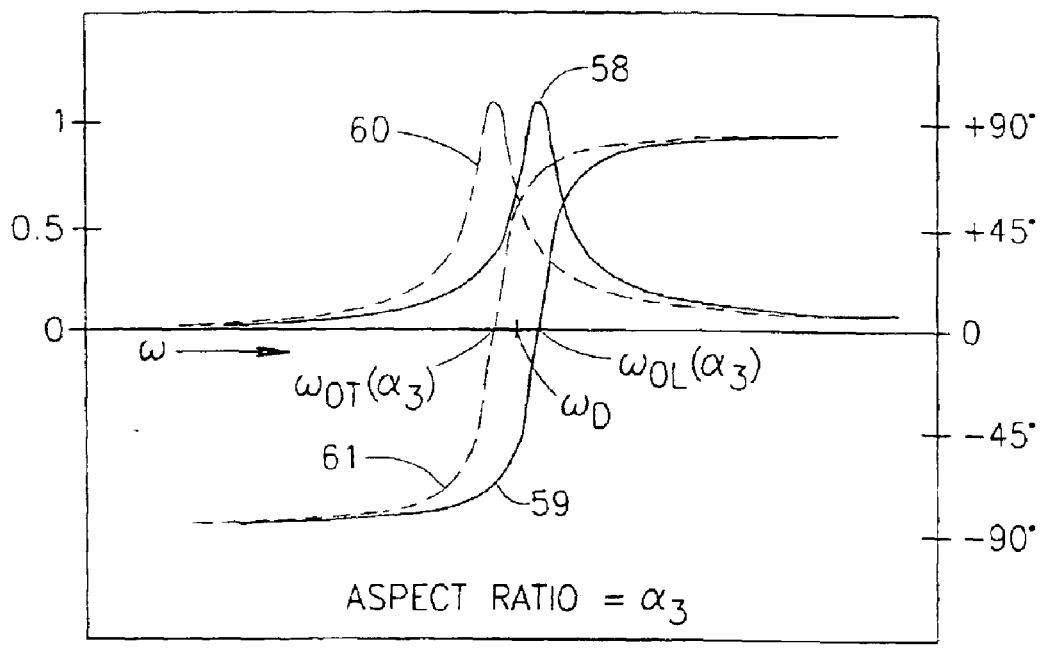

FIG. 1D is a graph for aspect ratio $\alpha_3$ that shows schematic excitation curves 58 and 60 for the longitudinal and transverse vibration modes. The resonant frequencies of the longitudinal and transverse vibration modes, at which frequencies excitation curves 58 and 60 have maxima, are represented by $\omega_{oL}(\alpha 3)$ and $\omega_{oT}(\alpha 3)$ respectively. Curves 59 and 61 associated with excitation curves 58 and 60 respectively, graph the excitation phase difference as a function of ω for the longitudinal and transverse vibration modes. Excitation curves 58 and 60 overlap sufficiently so that in a range of frequencies in the neighborhood of a driving frequency $\omega_D$, both longitudinal and transverse vibration modes are relatively efficiently excited. The mode phase difference at $\omega_D$, which is the difference between the ordinates of excitation phase curves 59 and 61 at $\omega_D$, is approximately equal to 90°.

Figure 1E:
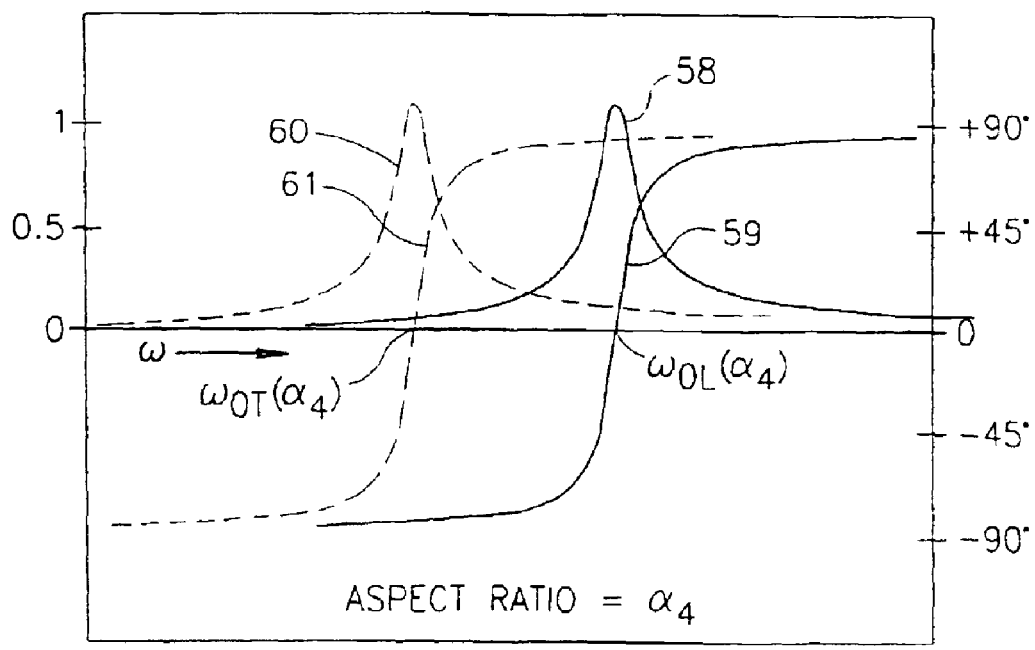

For some applications, amplitudes of the transverse vibration mode of vibrator 22 at aspect ratio $\alpha_3$ are not large enough and it is advantageous to choose an aspect ratio, $\alpha_4$, which is shown in FIG. 1B, for piezoelectric motor 22 that is smaller than $\alpha_3$. FIG. 1E is a graph of excitation curves 58 and 60 and associated excitation phase curves 59 and 61 for aspect ratio $\alpha_4$. From the curves it is readily seen that resonant frequencies $\omega_{oL}(\alpha_4)$ and $\omega_{oT}(\alpha_4)$ are relatively far apart and there is no frequency for which both longitudinal and transverse vibration modes can both be efficiently excited simultaneously. For aspect ratio $\alpha_4$, piezoelectric motor 22 is practically inoperable.

Figure 2A:
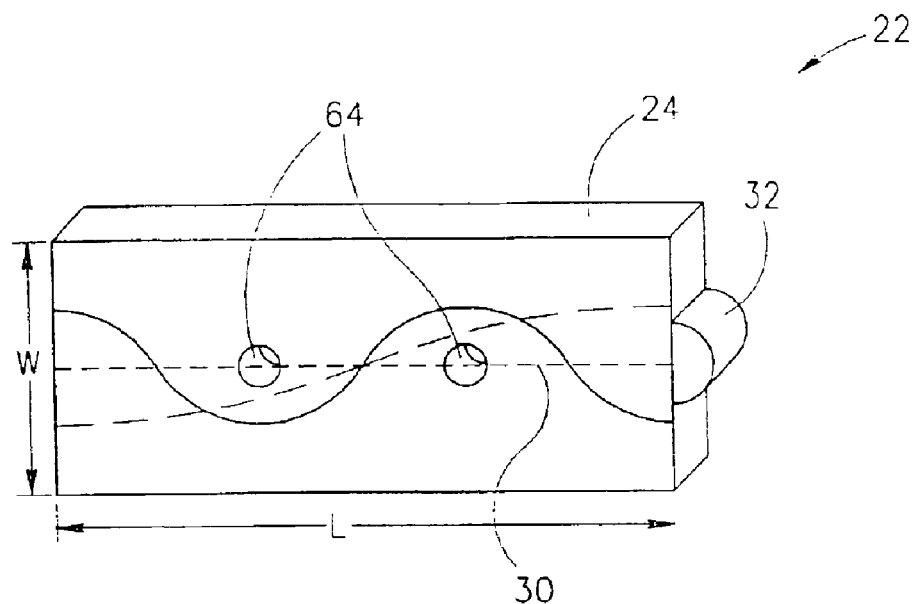
FIG. 2A schematically shows the piezoelectric motor shown in FIG. 1 with holes formed in the body of its vibrator in accordance with a preferred embodiment of the present invention.

FIG. 2A schematically shows piezoelectric motor 22 shown in FIG. 1A having an aspect ratio $\alpha_4$ with holes 64 formed in the body of vibrator 22, in accordance with a preferred embodiment of the present invention. Holes 64 are preferably through holes located along axis 30 at antinodes of the (second order) transverse vibration mode of piezoelectric vibrator 22. For the transverse vibration mode therefore, the effect of holes 64 on density dominates the effect of holes 64 on Young's modulus in shifting resonant frequency $\omega_{oT}(\alpha_4)$ of the vibration mode, and $\omega_{oT}(\alpha_4)$ increases. The antinodes of the transverse vibration mode and therefore holes 64 are located near to the single nodal point of the longitudinal vibration mode on axis 30. For the longitudinal vibration mode, the effect of holes 64 on Young's modulus dominates the effect of holes 64 on density and resonant frequency $\omega_{oL}(\alpha_4)$ decreases. Therefore, as a result of the presence of holes 64, in accordance with a preferred embodiment of the present invention, excitation curves 58 and 60, which are normally far apart for aspect ratio $\alpha_4$, converge and overlap substantially.

Figure 2B:
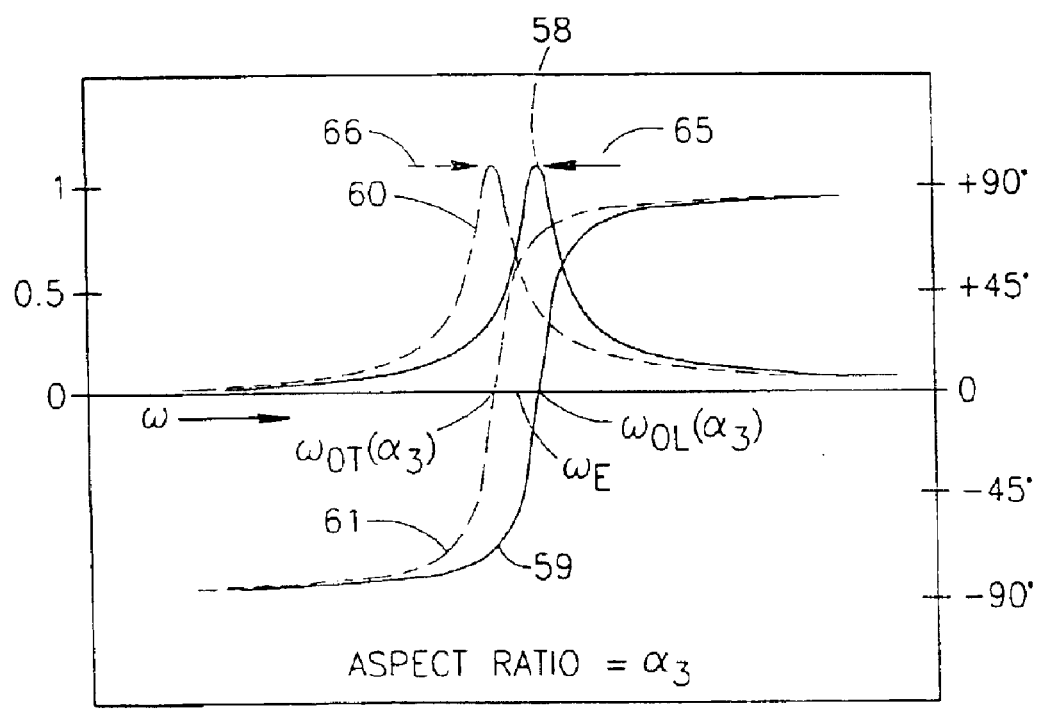
FIG. 2B is a graph of excitation curves of the first order longitudinal vibration mode and second order transverse vibration mode, in accordance with a preferred embodiment of the present invention.

FIG. 2B is a graph that shows excitation curves 58 and 60 and excitation phase curves 59 and 61 for aspect ratio $\alpha_4$ as functions of frequency $\omega$ for the longitudinal and transverse vibration modes of piezoelectric vibrator 22 formed with holes 64. From excitation curves 58 and 60 it is seen that the convergence of excitation curves 58 and 60 is sufficient so that there is a range of frequencies in a neighborhood of a frequency $\omega_D$ at which both longitudinal and transverse vibration modes can be efficiently excited. From excitation phase curves 59 and 61 it is seen that at $\omega_D$ a mode phase difference for the vibration modes is substantially equal to 90°. Solid and dashed arrows 65 and 66 indicate directions in which holes 64 move excitation curves 58 and 60 respectively compared to the locations of excitation curves 58 and 60 shown in FIG. 1E. As a result of holes 64, piezoelectric motor 20 is operable with vibrator 22 having aspect ratio $\alpha_4$.

It should be noted that whereas holes 64 are shown as through holes, in some preferred embodiments of the present invention holes 64 are "blind" holes that do not penetrate completely through vibrator 22. In addition, it should be noted that the location of holes 64 shown in FIG. 2A is by way of example and holes, in accordance with a preferred embodiment of the present invention, can be formed in different locations of piezoelectric vibrator 22, and such different locations can be advantageous.

By way of example illustrating the effect of holes 64 on frequencies of the longitudinal and transverse vibration modes in vibrator 22 of a piezoelectric motor 20, assume that vibrator 22 is typical of prior art vibrators of its type. Let vibrator 22 have a thickness equal to 3 mm, a width W=7.5 mm, a length L=30 mm and be formed from a piezoelectric material having a Young's modulus equal to $7.9 \times 10^{10}$ N/m². For this configuration of piezoelectric vibrator 22, a first longitudinal vibration mode of the vibrator has a resonant frequency of about 54 kHz and a second transverse vibration mode of the vibrator has a resonant frequency equal to 48.7 kHz.

The second transverse vibration mode of piezoelectric vibrator 22 for the above specifications has an antinode along axis 30 located 10 mm from each short edge surface 24. The inventors have found that forming a hole having a diameter of about 2 mm that passes through axis 30 of motor 22 at each antinode, shifts the longitudinal frequency from 54 kHz to 51.8 kHz and the transverse frequency from 48.7 kHz to 50.9 kHz. Preferably vibrator 22 is excited by an AC voltage having a frequency about 49.9 kHz.

In some situations it is desirable to diverge excitation curves of two resonant vibration modes of a piezoelectric motor instead of converge them. Such a situation can occur when it is advantageous to excite only one vibration mode in a vibrator.

Figure 3A:
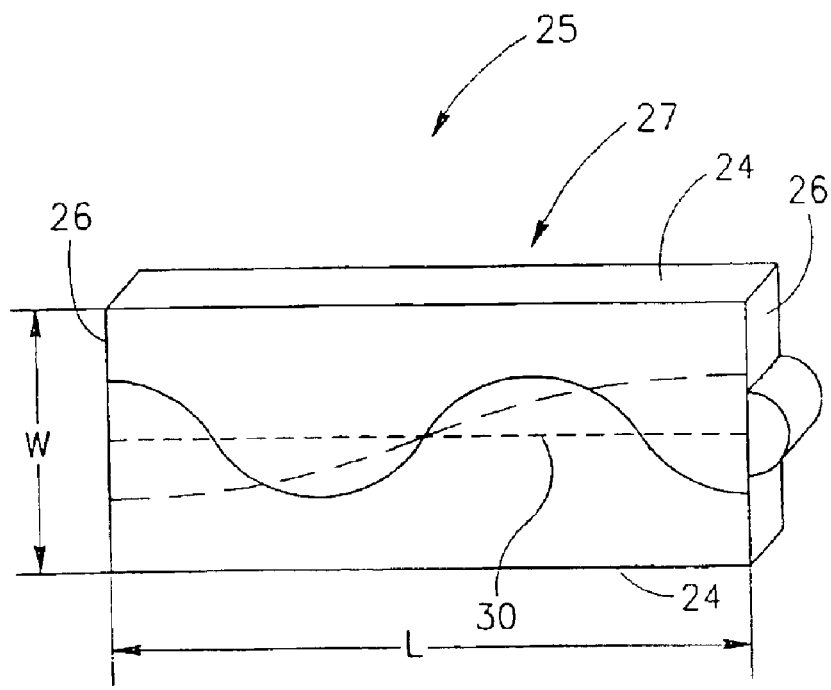
FIG. 3A schematically shows another piezoelectric motor according to prior art.
Figure 3B:
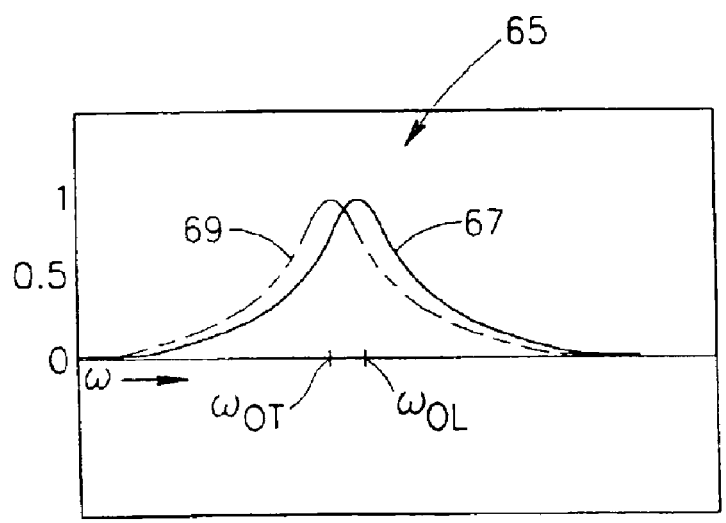
FIG. 3B is a graph of excitation curves of a first order longitudinal vibration mode and a second order transverse vibration mode of the vibrator of the piezoelectric motor shown in FIG. 3A, in accordance with a preferred embodiment of the present invention.

FIG. 3A shows a piezoelectric motor 25 similar to piezoelectric motor 20 shown in FIG. 1A. Piezoelectric motor 25 comprises a vibrator 27 that has a first order longitudinal vibration mode and a second order transverse vibration mode characterized by relatively broad excitation curves that overlap substantially. FIG. 3B is a graph that shows schematic excitation curves 67 and 69 for the longitudinal and transverse vibration modes respectively. The resonant frequencies of the longitudinal and transverse vibration modes are respectively noted as $\omega_{oL}$ and $\omega_{oT}$. Assume that in operation of piezoelectric motor 25 it is desired to excite only the longitudinal vibration mode of vibrator 27. From graph 65 it is seen that it is difficult to excite one of the vibration modes without exciting the other. Excitation of one of the vibration modes without the other can be accomplished using specially designed electrodes. However, when piezoelectric motor 25 is coupled to a load, as a result of coupling to the load, the vibration modes can be coupled to each other. As a result the efficiency with which the specially designed electrodes couple energy to only one of the modes but not the other is reduced. The inventors have found that by forming at least one hole in vibrator 27 that is preferably located on axis 30 at a node of the second transverse vibration of the vibrator, excitation curves 67 and 69 diverge and the amount of their overlap is reduced. The effect of holes at nodes of the second transverse vibration mode of a vibrator similar to that shown in FIGS. 1–3 is opposite to the effect of holes located at antinodes of the vibration mode.

Figure 4A:
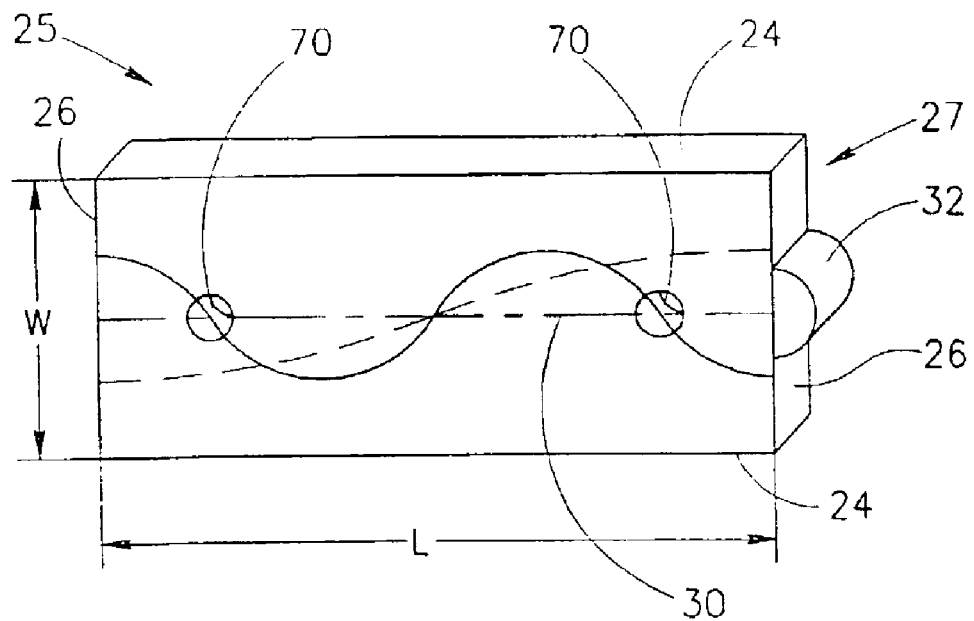
FIG. 4A schematically shows the piezoelectric motor shown in FIG. 3 with holes formed in its vibrator, in accordance with a preferred embodiment of the present invention.

FIG. 4A shows piezoelectric motor 25 with two holes 70 formed in vibrator 24. Preferably, holes 70 are through holes located along axis 30 of vibrator 25. Preferably, one hole 70 is formed at a node of the second resonant transverse vibration near to each short edge surface 26 of vibrator 25. For the transverse vibration mode the effect of holes 70 on Young's modulus dominates the effect of holes 70 on density in shifting resonant frequency $\omega_{oT}$, and $\omega_{oT}$ decreases. The nodes of the transverse vibration mode are located relatively far from the single nodal point on axis 30 of the longitudinal vibration mode. For the longitudinal vibration mode the effect of holes 70 on density dominates the effect of holes 70 on Young's modulus and resonant frequency $\omega_{oL}$ increases. Therefore holes 70 cause excitation curves 67 and 69 shown in FIG. 3B to diverge.

Figure 4B:
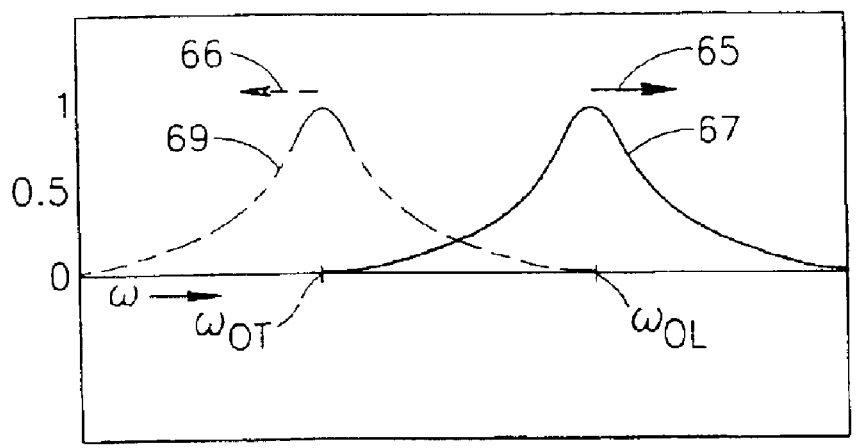
FIG. 4B is a graph of excitation curves of the first order longitudinal vibration mode and second order transverse vibration mode of the vibrator of the piezoelectric motor shown in FIG. 4A.

FIG. 4B shows schematic excitation curves 67 and 69 for piezoelectric vibrator 25 formed with holes 70. Solid and dashed arrows 65 and 66 indicate directions in which holes 70 move excitation curves 67 and 69 respectively compared to the locations of excitation curves 67 and 69 shown in FIG. 3B.

The inventors have found that a groove on the surface of a vibrator can be used to shift resonant frequencies of vibration modes of the vibrator. For a vibrator of a type shown in the preceding figures the inventors have found that at least one groove on a short edge surface or a long edge surface of the vibrator shifts resonant frequencies of vibration modes of the vibrator.

For example, the inventors have found that at least one groove formed on a long edge surface 24 of vibrator 25 shown in FIGS. 3 and 4, in addition to or instead of holes 70 may be used, in accordance with a preferred embodiment of the present invention, to diverge excitation curves 67 and 69.

Figure 5A:
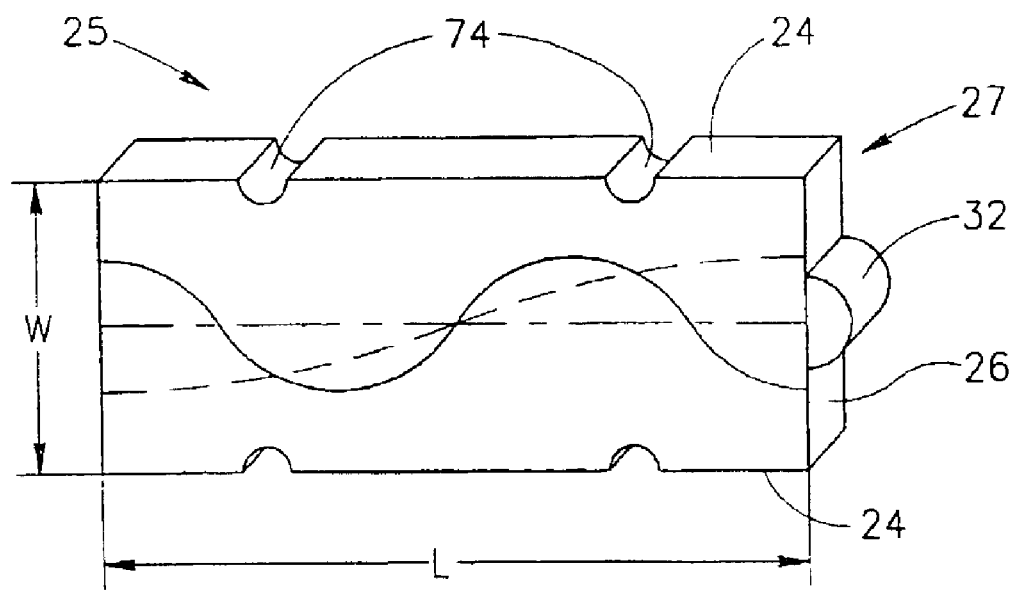
FIG. 5A schematically shows the piezoelectric motor shown in FIG. 3 with grooves formed on long edge surfaces of its vibrator, in accordance with a preferred embodiment of the present invention.

FIG. 5A shows piezoelectric vibrator 25 with a plurality of grooves 74 preferably formed on long edge surfaces 24 of piezoelectric vibrator 22, in accordance with a preferred embodiment of the present invention. Preferably, for each groove 74 on one long edge surface 24 there is a groove opposite it on the other long edge 24. Grooves 74 perturb width W of vibrator 27 and cause the width, and thereby the aspect ratio, of vibrator 27 to be locally decreased in the neighborhoods of grooves 74. Generally, for most useful ranges of aspect ratio α, the resonant frequencies of the transverse vibration modes decrease with decreasing aspect ratio. The effect of grooves 74 on width W therefore tends to decrease the resonant frequencies of the transverse vibration modes and cooperates with the effect of grooves 70 on Young's modulus, which also tends to decrease the resonant frequencies of the transverse mode. Grooves 74 therefore generally tend to decrease the resonant frequencies of the transverse vibration modes. On the other hand, grooves 74 do not generally substantially affect the resonant frequencies of the longitudinal modes. As a result, grooves 74 diverge excitation curves 67 and 69. Preferably, in using grooves 74 to decrease the resonant frequency of a transverse vibration mode of vibrator 27 the grooves are located at or close to nodal regions of the transverse vibration mode on long edge surfaces 24.

Figure 5B:
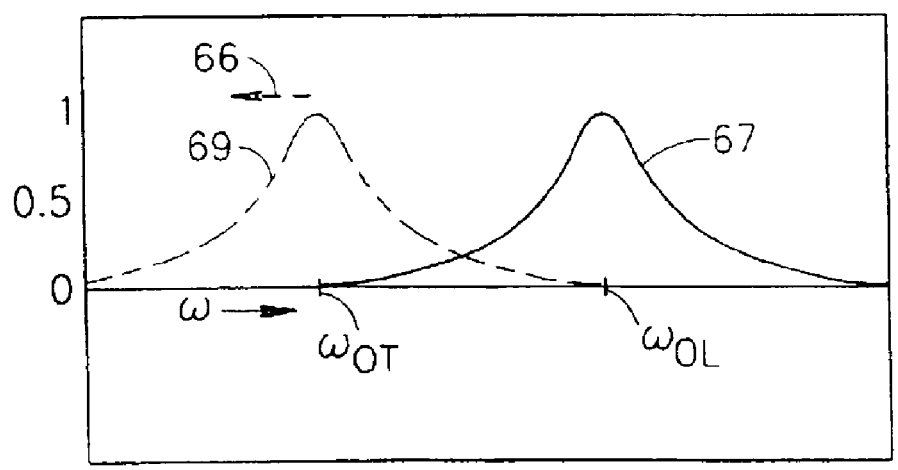
FIG. 5B is a graph of excitation curves of the first order longitudinal vibration mode and second order transverse vibration mode of the vibrator of the piezoelectric motor shown in FIG. 5A.

FIG. 5B is a graph that shows schematic excitation curves 67 and 69 diverged as a result of grooves 74. Since grooves 74 do not substantially affect the resonant frequency of the longitudinal vibration mode, excitation curve 67 in FIG. 5B is located in substantially the same range of frequencies as excitation curve 67 in FIG. 3B. Dashed arrow 66 indicates the direction in which groove 74 moves excitation curve 69 compared to the location of excitation curve 69 shown in FIG. 3B.

Figure 6A:
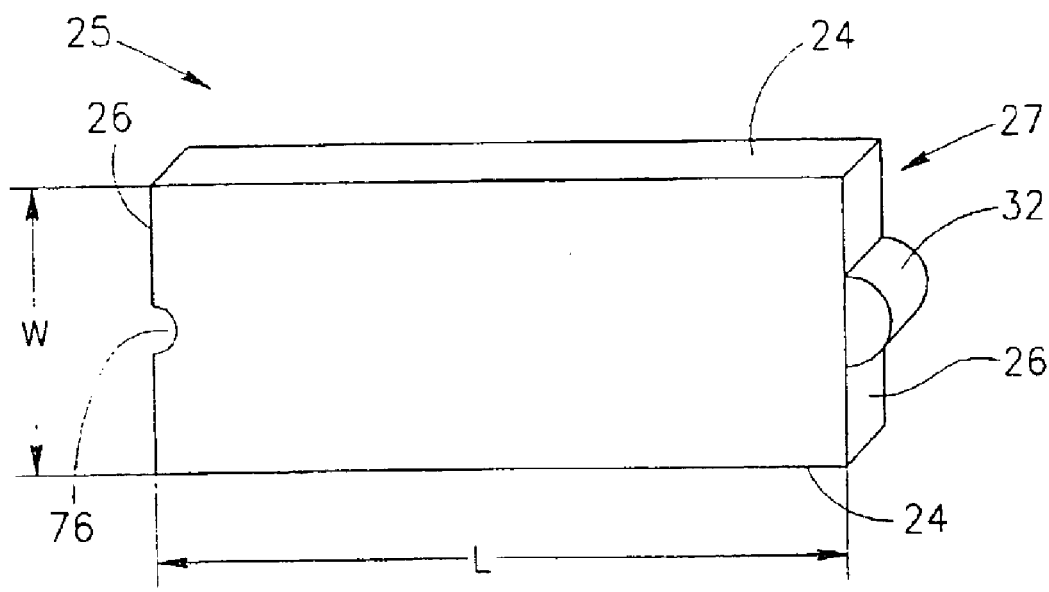
FIG. 6A schematically shows the piezoelectric motor shown in FIG. 3 with grooves formed on a short edge surface of its vibrator, in accordance with a preferred embodiment of the present invention.

FIG. 6A shows piezoelectric vibrator 25 with a groove 76 formed on the short edge surface 26 of the vibrator opposite to friction nub 32, in accordance with a preferred embodiment of the present invention. Groove 76 perturbs the length L of vibrator 27 and "locally" shortens the length. The longitudinal resonant frequencies are generally inversely proportional to length L. The effect of groove 76 on L therefore tends to increase the resonant frequencies of the longitudinal vibration modes and cooperates with the effect of groove 76 on mass density, which also tends to increase the resonant frequencies of the longitudinal mode. As a result, groove 76 generally increases the longitudinal resonant frequencies of the longitudinal vibration modes of vibrator 27. The inventors have found that groove 76 does not substantially affect the resonant frequencies of the transverse vibration modes. As a result, groove 76 also diverges excitation curves 67 and 69.

Figure 6B:
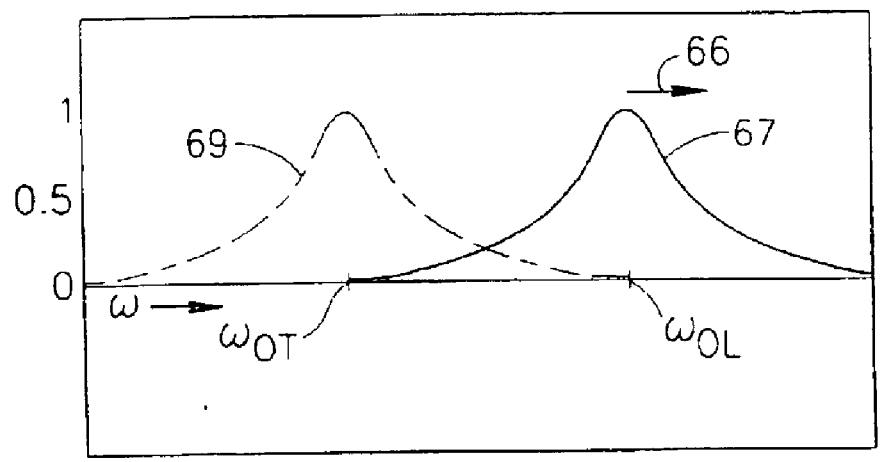
FIG. 6B is a graph of excitation curves of the first order longitudinal vibration mode and second order transverse vibration mode of the vibrator of the piezoelectric motor shown in FIG. 6A.

FIG. 6B is a graph that shows schematic excitation curves 67 and 69 diverged as a result of groove 76. Since groove 76 does not substantially affect the resonant frequency of the transverse vibration mode, excitation curve 69 in FIG. 6B is located in substantially the same range of frequencies as excitation curve 69 in FIG. 3B. Solid arrow 65 indicates the direction in which groove 76 move excitation curve 67 compared to the location of excitation curve 67 shown in FIG. 3B.

It should be noted that in the above discussion and preceding figures, the resonant frequency of the second order transverse vibration mode is lower than the resonant frequency of the first order longitudinal vibration mode (except for the situation shown in FIG. 1 in which the resonant frequencies are equal). This is of course not necessary and in accordance with preferred embodiments of the present invention, the resonant frequency of the second order transverse vibration mode can be greater than the resonant frequency of the first order longitudinal vibration mode. The effect of at least one hole and at least one groove in diverging or converging resonant frequencies as described above is reversed if the resonant frequency of the transverse vibration mode is greater than the resonant frequency of the longitudinal mode in the preceding figures.

In the above description piezoelectric vibrators are shown having either, but not both, at least one hole or at least one groove to shift resonant frequencies of the vibrators, in accordance with a preferred embodiment of the present invention. In some preferred embodiments of the present invention a vibrator is formed with both at least one hole and at least one groove to shift resonant frequencies of the vibrator.

Piezoelectric ceramics from which piezoelectric motors are generally formed are relatively brittle materials that are prone to fracturing that can result in "catastrophic" failure of the material. For a vibrator formed with a hole or a groove, in accordance with a preferred embodiment of the present invention, fracturing of the material of the piezoelectric motor is generally enhanced in the vicinity of the hole or groove.

In some preferred embodiments of the present invention, the surface of a hole or groove formed in a piezoelectric vibrator is bonded with a layer of elastic material that functions as a crack arrest layer to reduce fracturing of the material of the vibrator in the vicinity of the hole or groove. In some preferred embodiments of the present invention, the hole or groove is filled with an elastic material to reduce fracturing. Preferably, the elastic material is a flexible epoxy. In determining the amount by which a hole or groove shifts a resonant frequency of the vibrator, the effect of Young's modulus and the density of the elastic material used as a filler must be taken into account.

Figure 7A:
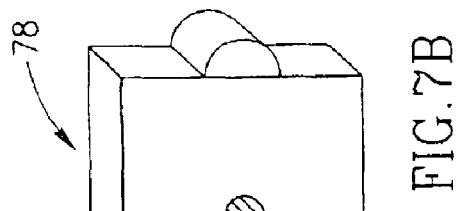
FIGS. 7A–7D schematically show different configurations of holes and grooves in a piezoelectric motor that are lined or filled with a resilient "crack arrest" material, in accordance with a preferred embodiment of the present invention.
Figure 7B:
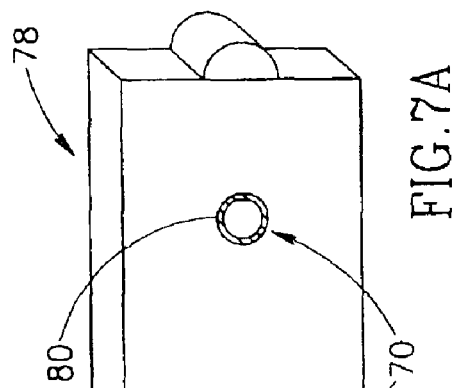
Figure 7C:
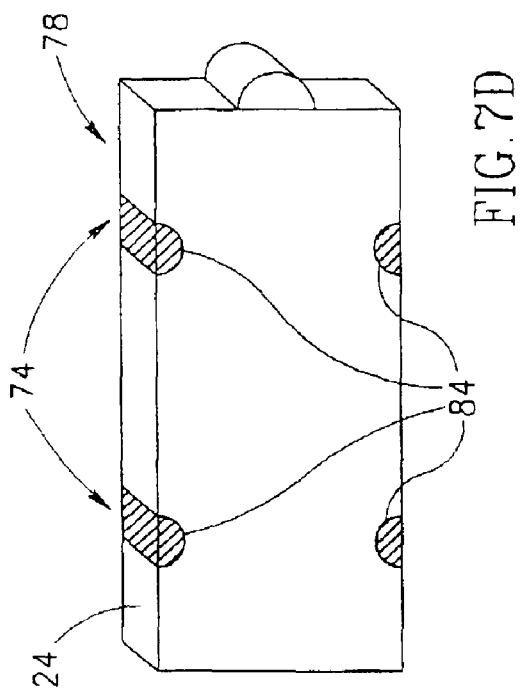
Figure 7D:
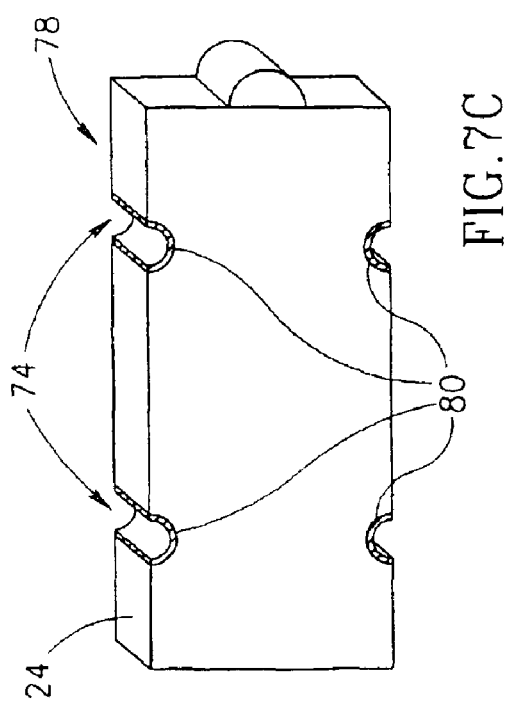

FIG. 7A schematically shows a piezoelectric motor 78, similar to piezoelectric motor 25, having holes 70, in which the walls of the holes are bonded with a layer of an elastic crack arrest material 80 to reduce fracturing, in accordance with a preferred embodiment of the present invention. FIG. 7B shows motor 78 in which holes 70 are filled with an elastic material 84 to arrest cracking, in accordance with a preferred embodiment of the present invention FIG. 7C shows motor 78 having grooves 74 formed on its long edges 24, which the grooves are lined with a layer of crack arrest material 80, in accordance with a preferred embodiment of the present invention. FIG. 7D shows grooves 74 filled with an elastic crack arrest material 84, in accordance with a preferred embodiment of the present invention.

In the description and claims of the present application, each of the verbs, "comprise" "include" and "have", and conjugates thereof are used to indicate that the object or objects of the verb are not necessarily a complete listing of members, components, elements or parts of the subject or subjects of the verb.

The present invention has been described using detailed descriptions of preferred embodiments thereof that are provided by way of example and are not intended to limit the scope of the invention. The described preferred embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

What is claimed is:

1. A method of producing a piezoelectric vibrator comprising:

producing a thin rectangular piezoelectric plate from a material having a Young's modulus, the plate having two short edge surfaces, two long edge surfaces, two large planar face surfaces and transverse and longitudinal resonant vibration modes respectively parallel to the short and long edges and having formed therein at least one cavity;

forming at least one electrode on each of the planar surfaces that is electrifiable to excite at least one vibration mode of the plate; and determining a desired convergence or a desired divergence between resonant frequencies of a first vibration mode and a second vibration mode of the vibration modes of the plate relative to a difference in their frequencies in the absence of the at least one cavity;

wherein the at least one cavity is not filled with a material having a Young's modulus substantially equal to the Young's modulus of the material from which the plate is formed and shifts the resonant frequencies of the first and second vibration modes to provide the desired convergence or divergence.

2. A method according to claim 1 wherein the at least one cavity comprises a hole in a planar surface of the plate.

3. A method according to claim 2 wherein the hole is located so as to shift the resonant frequencies of the first and second vibration modes of the plate so that the resonant frequencies converge.

4. A method according to claim 2 wherein the hole is located so as to shift the resonant frequencies of the first and second vibration modes of the plate so that the resonant frequencies diverge.

5. A method according to claim 3 wherein the convergence caused by the hole is such that the efficiency with which the first and second vibration modes are simultaneously excitable by a same single frequency AC voltage is increased.

6. A method according to claim 5 wherein when the first and second vibration modes are excited by the single frequency AC voltage, a phase difference between the excited first and second vibration modes is substantially equal to 90°.

7. A method according to claim 3 wherein in the absence of the bole a same single frequency AC voltage cannot be used to simultaneously excite both vibration modes such that a phase difference between the excited vibration modes is substantially equal to 90°, and the shift caused by the presence of the hole is such that a same single frequency AC voltage can be used to simultaneously excite both vibration modes with a phase difference between the excited vibration modes substantially equal to 90°.

8. A method according to claim 4 wherein in the absence of the hole a same single frequency AC voltage can efficiently excite both vibration modes and wherein the divergence caused by the presence of the hole is such that a same single frequency AC voltage cannot efficiently excite both vibration modes.

9. A method according to claim 3 wherein the hole is located in a neighborhood of a node of the first vibration mode and decreases the resonant frequency of the first vibration mode.

10. A method according to claim 9 wherein the hole is located substantially at the position of the node of the first vibration mode.

11. A method according to claim 3 wherein the hole is located in a neighborhood of an antinode of the second vibration mode and increases the resonant frequency of the second vibration mode.

12. A method according to claim 11 wherein the hole is located substantially at the position of the antinode of the second vibration mode.

13. A method according to claim 3 wherein the hole is located in a neighborhood of a node of the first vibration mode and a neighborhood of an antinode of the second vibration mode.

14. A method according to claim 3 wherein the first vibration mode is a longitudinal vibration mode of the plate.

15. A method according to claim 3 wherein the second vibration mode is a transverse vibration mode of the plate.

16. A vibrator method according to claim 2 wherein the hole is a through hole.

17. A method according to claim 1 wherein the at least one cavity comprises a groove on at least one long edge surface of the plate that reduces a resonant frequency of a transverse vibration mode of the plate.

18. A method according to claim 1 wherein the at least one cavity comprises a groove on at least one short edge surface of the plate that increases a resonant frequency of a longitudinal vibration mode of the plate.

19. A method according to claim 1 wherein the at least one cavity comprises at least one groove located on an edge surface of the plate so as to shift the resonant frequencies of the first and second vibration modes so that they diverge.

20. A method according to claim 1 wherein the at least one cavity comprises at least one groove located on an edge surface of the plate so as to shift the resonant frequencies of the first and second vibration modes so that they diverge.

21. A method according to claim 19 wherein the convergence caused by the at least one groove is such that the efficiency with which the first and second vibration modes are simultaneously excitable by a same single frequency AC voltage is increased.

22. A method according to claim 21 wherein when the first and second vibration modes are excited by the single frequency AC voltage, a phase difference between the excited first and second vibration modes is substantially equal to 90°.

23. A method according to claim 19 wherein in the absence of the at least one groove a same single frequency AC voltage cannot be used to simultaneously excite both vibration modes such that a phase difference between the excited vibration modes is substantially equal to 90°, and the shift caused by the presence of the at least one groove is such that a same single frequency AC voltage can be used to simultaneously excite both vibration modes with a phase difference between the excited vibration modes substantially equal to 90°.

24. A method according to claim 19 wherein the first vibration mode is a longitudinal vibration mode.

25. A method according to claim 24 wherein the at least one groove comprises a groove on a short edge surface of the vibrator that increases the frequency of the vibration mode.

26. A method according to claim 19 wherein the second vibration mode is a transverse vibration mode.

27. A method according to claim 26 wherein the at least one groove comprise a groove on a long edge surface of the vibrator.

28. A method according to claim 1 and comprising at least one protuberance formed on a face surface of the plate that shifts a resonant frequency of at least one vibration mode of the plate with respect to the resonant frequency that characterizes the at least one vibration mode in the absence of the at least one protuberance.

29. A method according to claim 1 wherein a layer of an elastic material is bonded to the wall of the cavity.

30. A method according to claim 1 wherein a cavity of the at least one cavity is filled with an elastic material that bonds to the material from which the plate is formed and has a Young's modulus different from that of the material of the plate.

31. A method according to claim 4 wherein the hole is located in a neighborhood of a node of the first vibration mode and decreases the resonant frequency of the first vibration mode.

32. A method according to claim 31 wherein the hole is located substantially at the position of the node of the first vibration mode.

33. A method according to claim 4 wherein the hole is located in a neighborhood of an antinode of the second vibration mode and increases the resonant frequency of the second vibration mode.

34. A method according to claim 33 wherein the hole is located substantially at the position of the antinode of the second vibration mode.

35. A method according to claim 4 wherein the hole is located in a neighborhood of a node of the first vibration mode and a neighborhood of an antinode of the second vibration mode.

36. A method according to claim 4 wherein the first vibration mode is a longitudinal vibration mode of the plate.

37. A method according to claim 4 wherein the second vibration mode is a transverse vibration mode of the plate.

38. A method according to claim 20 wherein the first vibration mode is a longitudinal vibration mode.

39. A method according to claim 38 wherein the at least one groove comprises a groove on a short edge surface of the vibrator that increases the frequency of the vibration mode.

40. A method according to claim 20 wherein the second vibration mode is a transverse vibration mode.

41. A method according to claim 40 wherein the at least one groove comprise a groove on a long edge surface of the vibrator.

* * * * *